United States Patent
Yang et al.

(10) Patent No.: US 10,260,872 B2
(45) Date of Patent: Apr. 16, 2019

(54) LTPS MULTILAYERED STRUCTURE AND METHOD FOR MEASURING MISALIGNMENT IN THE SAME STRUCTURE

(71) Applicant: EverDisplay Optronics (Shanghai) Limited, Shanghai (CN)

(72) Inventors: Ching Che Yang, Shanghai (CN); Yu Chia Huang, Shanghai (CN); Wei-Liang Wu, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 1042 days.

(21) Appl. No.: 14/682,740

(22) Filed: Apr. 9, 2015

(65) Prior Publication Data
US 2015/0294941 A1   Oct. 15, 2015

(30) Foreign Application Priority Data

Apr. 10, 2014  (CN) .......................... 2014 1 0143349

(51) Int. Cl.
| | |
|---|---|
| *H01L 23/544* | (2006.01) |
| *G01B 21/16* | (2006.01) |
| *G03F 7/20* | (2006.01) |
| *H01L 21/66* | (2006.01) |

(52) U.S. Cl.
CPC ......... *G01B 21/16* (2013.01); *G03F 7/70633* (2013.01); *H01L 22/12* (2013.01); *H01L 22/30* (2013.01)

(58) Field of Classification Search
CPC ... G03F 7/70633; G03F 9/7076; H01L 23/544
See application file for complete search history.

(56) References Cited

U.S. PATENT DOCUMENTS

| | | | | |
|---|---|---|---|---|
| 5,017,514 | A * | 5/1991 | Nishimoto | .......... G03F 7/70591 356/400 |
| 6,675,053 | B2 | 1/2004 | Baluswamy et al. | |
| 2003/0027368 | A1 * | 2/2003 | Baluswamy | ........ G03F 7/70633 438/16 |
| 2010/0035367 | A1 | 2/2010 | Izuha et al. | |

FOREIGN PATENT DOCUMENTS

CN    101465306 A1    6/2009

OTHER PUBLICATIONS

The 1st office action issued in the counterpart CN application No. 201410143349.0 dated Apr. 25, 2017 by the SIPO.
The 1st office action issued in the counterpart TW application No. 103129611 dated Feb. 17, 2016 by the TIPO.

* cited by examiner

*Primary Examiner* — Thomas L Dickey
(74) *Attorney, Agent, or Firm* — Yunling Ren (57) ABSTRACT

The present application provides an LTPS multilayered structure, which includes: a first stack layer having a reference pattern structure formed thereon and provided with uniformly distributed first references; and a second stack layer disposed on the first stack layer and having an alignment pattern structure formed thereon and provided with uniformly distributed second references each selectively aligning with one of the first references so that misalignment between the first stack layer and the second stack layer is precisely calculated by markings attached to each of the first references. The present further provides a method for measuring misalignment between a plurality of stack layers in the LTPS multilayered structure.

15 Claims, 5 Drawing Sheets

LTPS MULTILAYERED STRUCTURE AND METHOD FOR MEASURING MISALIGNMENT IN THE SAME STRUCTURE

CROSS REFERENCE TO RELATED APPLICATIONS

The present application claims priority under 35 U.S.C. § 119 to Chinese Patent Applications No. 201410143349.0, filed on Apr. 10, 2014, the entire contents of which are incorporated herein by reference.

TECHNICAL FIELD

The present disclosure relates to a Low Temperature Poly Silicon (LTPS) multilayered structure and a method for measuring misalignment in the multilayered structure, in particular to a multilayered structure having reference pattern structure and a method for measuring misalignment between a plurality of stack layers in the LTPS multilayered structure.

BACKGROUND

Figure 1:
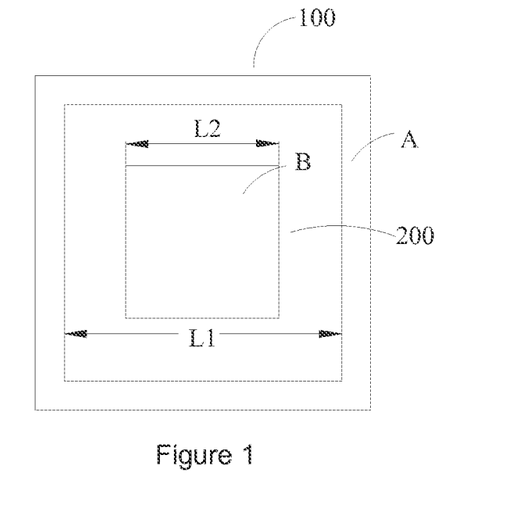
FIGS. 1 and 2 show schematic diagrams of conventional methods for measuring a misalignment in a multilayered structure.

Recently, manufacturing processes of Thin Film Transistor (TFT) array substrate and LTPS needs to ensure that there is no misalignment between multilayered stack structures. Therefore, in the processes of stacking the multilayered structures, it is needed to monitor and measure misalignment between layers and to adjust the misalignment in time. If there is an error in the misalignment measurement, it may influence subsequent processes, resulting in a decline in product yield. Generally, a box type mark is adopted as a basis for judging an alignment in order to improve accuracy of misalignment measurement and thereby to meet requirements of high resolution. As shown in FIG. 1, the n-th stacked layer (for example the first layer) is taken as a reference layer 100, and the (n+m)-th layer (for example the second layer) is taken as an alignment layer 200. A frame shaped reference mark A is arranged around the reference layer 100, and a square alignment mark B is arranged in the middle of the alignment layer 200. If the center of the reference mark A is aligned with the center of the alignment mark B, that is, the alignment mark B is located in the middle position of the frame shaped reference mark A, there is no misalignment between the n-th layer and the (n+m)-th layer. If the center of the reference mark A does not overlap with the center of the alignment mark B, there is a misalignment between the n-th layer and the (n+m)-th layer. The misalignment is measured using inspection and measuring equipments, namely, the misalignment obtained by deducting the center of line L2 from the center of line L1 in FIG. 1 is measured.

Figure 2:
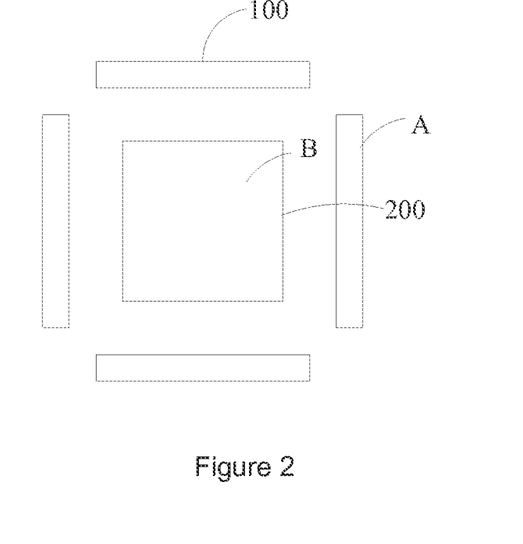

Another type of existing reference layer 100 is shown in FIG. 2. Four edges around the reference layer are not joined together, but measurement principle is the same as FIG. 1.

The conventional technologies as described above have shortcomings as follows:

Misalignments can only be judged using inspection and measuring equipments. Pattern defects or faults in the inspection and measuring equipments may cause that misalignments are not accordant to actual situation, and feedback of the wrong misalignments to an exposure machine may result in an exposure data error.

Hence, in the conventional technologies, misalignments are judged only depending on inspection and measuring equipments, it is difficult to measure these slight misalignments using other measuring equipments, thereby resulting in difficulties in judgment of measurement accuracy and thereby high error rate.

The above information disclosed in the background portion is only for the purposes of enhancing understanding of the background of the present disclosure, and thus it may include information which does not constitute prior art known to one of ordinary skill in this art.

SUMMARY

Embodiments of the present disclosure provide an LTPS multilayered structure and a method for measuring misalignment between a plurality of stack layers in the LTPS multilayered structure so as to accurately and quickly measure the misalignment between the multilayered structures.

The additional aspects and advantages of the present disclosure would be explained partly in the description below and would in part become apparent from the description, or can be acquired by implementing the present disclosure.

In accordance with one aspect of the present disclosure, an LTPS multilayered structure is provided, which includes: a first stack layer having a reference pattern structure formed thereon and provided with uniformly distributed first references; and a second stack layer disposed on the first stack layer and having an alignment pattern structure formed thereon and provided with uniformly distributed second references each selectively aligning with one of the first references so that misalignment between the first stack layer and the second stack layer is precisely calculated by markings attached to each of the first references.

In accordance with another aspect of the present disclosure, a method for measuring misalignment between a plurality of stack layers in an LTPS multilayered structure is provided. The LTPS multilayered structure includes: a first stack layer having a reference pattern structure formed thereon and provided with uniformly distributed first references; and a second stack layer disposed on the first stack layer and having an alignment pattern structure formed thereon and provided with uniformly distributed second references each selectively aligning with one of the first references. The method includes: stacking the first stack layer and the second stack layer; observing a first reference which is aligning with one of the second references, and reading a marking attached to the first reference which is aligning with one of the second references to calculate misalignment between the first stack layer and the second stack layer.

BRIEF DESCRIPTION OF THE DRAWINGS

Other features and advantages of the present disclosure described above will become clearer from detailed description of exemplary embodiments with reference to drawings.

DESCRIPTION OF THE EMBODIMENTS

Now, exemplary implementations will be described more comprehensively with reference to the drawings. However, the exemplary implementations may be carried out in various manners, and shall not be interpreted as being limited to the implementations set forth herein; instead, providing these implementations will make the present disclosure more comprehensive and complete and will fully convey the conception of the exemplary implementations to one of ordinary skill in this art. In the drawings, thicknesses of regions and layers are exaggerated for the sake of clarity. Throughout the drawings similar reference signs indicate the same or similar structures, and their detailed description will be omitted.

The features, structures or characteristics described herein may be combined in one or more embodiments in any suitable manner. In the following description, many specific details are provided to facilitate sufficient understanding of the embodiments of the present disclosure. However, one of ordinary skill in this art will appreciate that the technical solutions in the present disclosure may be practiced without one or more of the specific details, or other methods, elements, materials and so on may be employed. In other conditions, well-known structures, materials or operations are not shown or described in detail to avoid confusion of respective aspects of the present disclosure.

Figure 3:
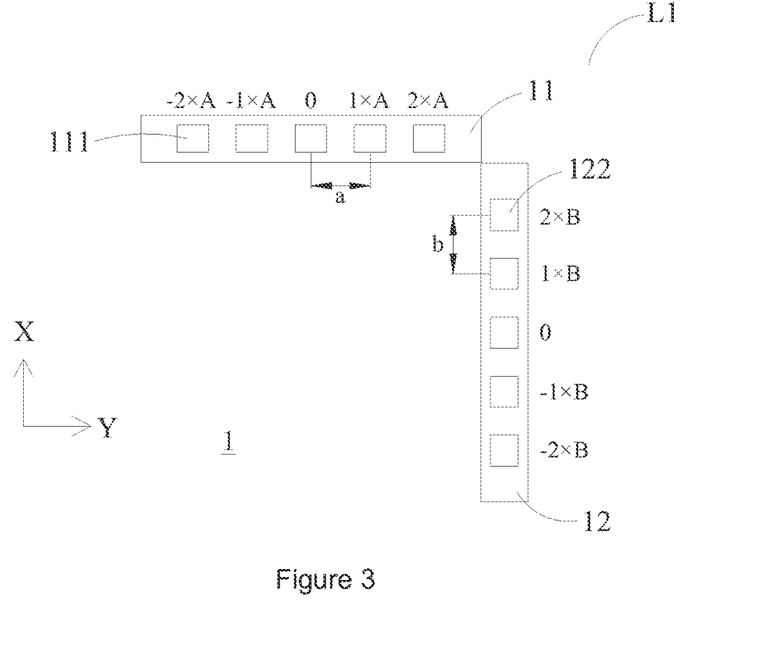
FIG. 3 shows a schematic diagram of a reference pattern structure according to an exemplary embodiment of the present disclosure.
Figure 4:
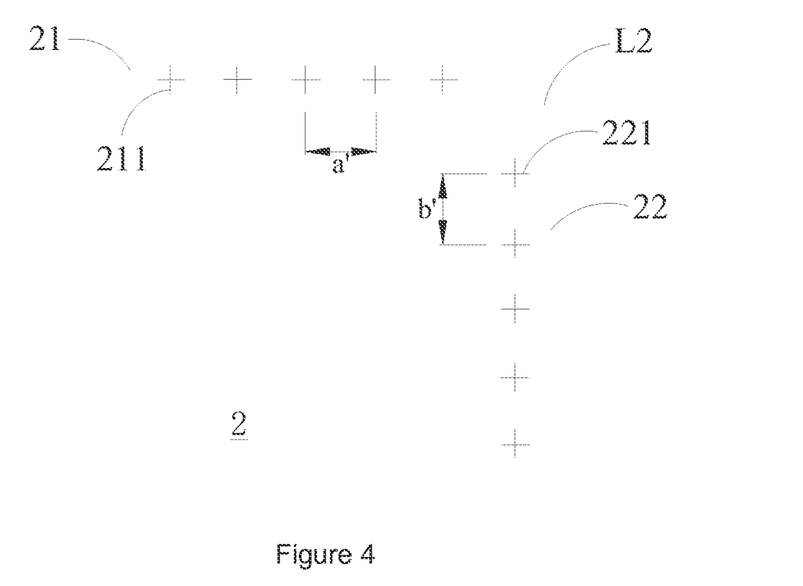
FIG. 4 shows a schematic diagram of an alignment pattern structure according to an exemplary embodiment of the present disclosure.

FIG. 3 shows a schematic diagram of a reference pattern structure according to an exemplary embodiment of the present disclosure, and FIG. 4 shows a schematic diagram of an alignment pattern structure according to an exemplary embodiment of the present disclosure.

The LTPS multilayered structure will be described below with reference to FIGS. 3 and 4.

The present disclosure provides an LTPS multilayered structure, which includes a first stack layer L1 and a second stack layer L2. The first stack layer L1 has a reference pattern structure 1 formed thereon and is provided with uniformly distributed first references. The second stack layer L2 is disposed on the first stack layer L1 and has an alignment pattern structure 2 formed thereon and is provided with uniformly distributed second references each selectively aligning with one of the first references so that misalignment between the first stack layer and the second stack layer is precisely calculated by markings attached to each of the first references.

According to an embodiment, the first references of the reference pattern structure 1 may have first reference marks arranged along an first direction (for example, the X direction in FIG. 3) and second reference marks arranged along a second direction (for example, the Y direction in FIG. 3) perpendicular to the first direction, and the second references of the alignment pattern structure 2 have first alignment marks arranged along the first direction and second alignment marks arranged along the second direction.

According to an embodiment, the first reference marks may include a plurality of first frames 111 and the second reference marks include a plurality of second frames 122, as shown in FIG. 3. The first frames 111 constitute a pattern 11, and the second frames 122 constitute a pattern 12. The first alignment marks include a plurality of first alignment symbols 211 and the second alignment marks include a plurality of second alignment symbols 221. The first alignment symbols 211 constitute a pattern 21, and the second alignment symbols 221 constitute a pattern 22.

Each of the first frames 111 is attached with a specific value marking different from others such that when one of the first frames 111 aligns with one of the first alignment symbols 211, the specific value marking indicates amount of the misalignment between the first stack layer L1 and the second stack layer L2 along the X direction.

The specific value markings attached to the first frames 111 may be sequentially labeled as 0, 1*A, 2*A . . . along the X direction, or may be sequentially and symmetrically labeled as . . . −2*A, −1*A, 0, 1*A, 2*A . . . along the X direction, wherein A is determined by $A=\Delta a=a-a'=a/n1$, a is a distance between centers of two adjacent first frames 111, a' is a distance between centers of two adjacent first alignment symbols 211, and n1 is the number of the first alignment symbols 211.

The principle of misalignment measurement in the present disclosure is similar with the principle of a vernier caliper, that is, the reference pattern structure 1 of the present disclosure is equivalent to a main scale of a vernier caliper, whereas the alignment pattern structure 2 is equivalent to a vernier of the vernier caliper.

Corresponding to the principle of a vernier caliper, A is accuracy of the vernier caliper, a is a minimum graduation of the main scale, a' is a minimum graduation of the vernier, and n1 represents n1 evenly divided graduation.

Therefore, according to reading methods of a vernier caliper, which alignment symbols 211 on the pattern 21 (namely, the vernier) is aligned with a frame 111 of the pattern 11 is observed. As shown in FIG. 3, the first one among the first alignment symbols 211 is aligned with the first one among the first frames 111, and then the misalignment in the X-direction is 1 multiplied by the accuracy, namely, the misalignment in the X-direction is F1=1*A=1A.

There is a distinction between the reference pattern structure of the present embodiment and the main scale of a vernier caliper. The reference pattern structure is not labeled with the minimum graduation a like the main scale, but is labeled with value markings 0, 1*A, 2*A . . . . The value marking which the frame having an aligned alignment symbol is the X-direction misalignment F1.

Likewise, the arrangement, the principle and the reading methods of the second patterns 12 and 22 in the Y-direction are similar to the above description.

Each of the second frames 122 is attached with a specific value marking different from others such that when one of the second frames 122 aligns with one of the second alignment symbols 221, the specific value marking indicates amount of the misalignment between the first stack layer L1 and the second stack layer L2 along the Y direction.

The specific value markings attached to the second frames 122 may be sequentially labeled as 0, 1*B, 2*B . . . along the Y direction, or may be sequentially and symmetrically labeled as . . . −2*B, −1*B, 0, 1*B, 2*B . . . along the Y direction, wherein B is determined by $B=\Delta b=b-b'=b/n2$, b is a distance between centers of two adjacent second frames 122, b' is a distance between centers of two adjacent second alignment symbols 221, and n2 is the number of the second alignment symbols 221.

Figure 5:
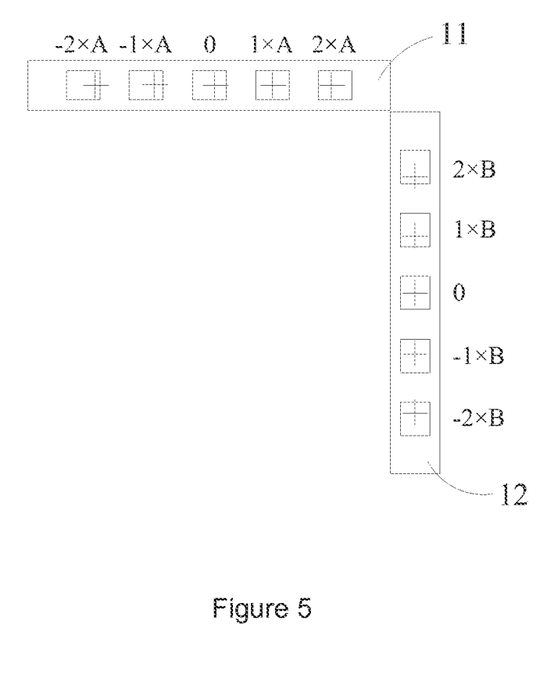
FIG. 5 shows a schematic diagram of a position relationship between frames and symbols after stacking of a first stack layer and a second stack layer.

FIG. 5 shows a schematic diagram of a position relationship between frames and symbols after stacking of a first stack layer and a second stack layer.

As shown in FIG. 5, when the first stack layer L1 is stacked with the second stack layer L2, one of the plurality of first frames 111 is aligned with one of the plurality of first symbols 211 in the X-direction, and one of the plurality of second frames 122 is aligned with one of the plurality of second symbols 221 in the Y-direction. The horizontal misalignment which an aligned first frame corresponds to is the misalignment in the X-direction between the first stack layer L1 and the second stack layer L2, and the vertical misalignment which an aligned second frame corresponds to is the misalignment in the Y-direction between the first stack layer L1 and the second stack layer L2.

In the present embodiment, a=b=20 µm, a'=b'=19.5 µm, and thus A=B=0.5 µm.

According to the observation of FIG. 5, the misalignment in the X-direction is F1=1*A=0.5 µm, and the misalignment in the Y-direction is F2=0.

Figure 6:
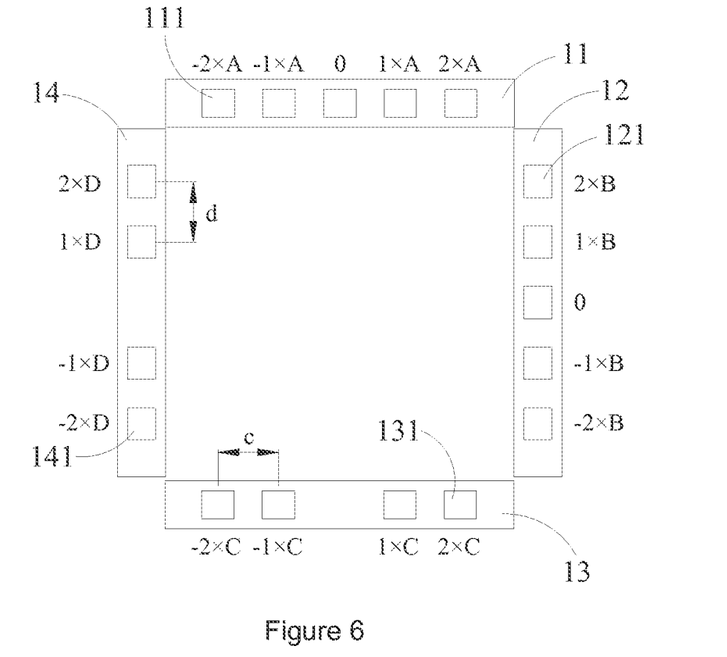
FIG. 6 shows a schematic diagram of a reference pattern structure according to an embodiment of the present disclosure.
Figure 7:
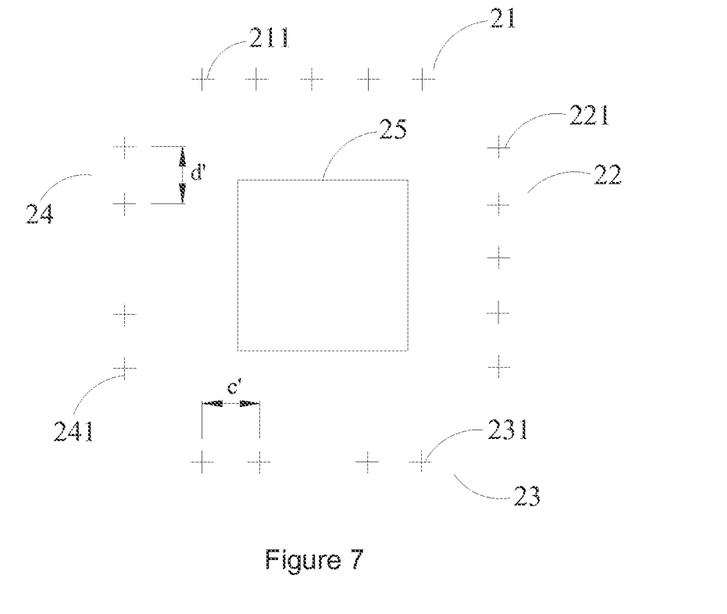
FIG. 7 shows a schematic diagram of an alignment pattern structure according to an exemplary embodiment of the present disclosure.

FIG. 6 shows a schematic diagram of a reference pattern structure according to an exemplary embodiment of the present disclosure, and FIG. 7 shows a schematic diagram of an alignment pattern structure according to an exemplary embodiment of the present disclosure.

As shown in FIGS. 6 and 7, the first references may further have third reference marks arranged along the X direction and fourth reference marks arranged along the Y direction. The first, the second, the third and the fourth reference marks form a frame shape. The second references further have third alignment marks arranged along the first direction and fourth alignment marks arranged along the second direction, and the first, the second, the third and the fourth alignment marks form a frame shape.

The third reference marks may include a plurality of third frames 131 and the fourth reference marks may include a plurality of fourth frames 141. The third frames 131 constitute a pattern 13 and the fourth frames 141 constitute a pattern 14. The third alignment marks may include a plurality of third alignment symbols 231 and the fourth alignment marks may include a plurality of fourth alignment symbols 241. The third alignment symbols 231 constitute a pattern 23 and the fourth alignment symbols 241 constitute a pattern 24.

Each of the third frames 131 is attached with a specific value marking different from others such that when one of the third frames 131 aligns with one of the third alignment symbols 231, the specific value marking indicates the amount of the misalignment between the first stack layer L1 and the second stack layer L2 along the X direction.

The specific value markings attached to the third frames 131 may be sequentially labeled as 0, 1*C, 2*C . . . along the X direction, or may be sequentially and symmetrically labeled as . . . −2*C, −1*C, 0, 1*C, 2*C . . . along the X direction, wherein C is determined by C=Δc=c−c'=c/n3, c is a distance between centers of two adjacent third frames 131, c' is a distance between centers of two adjacent third alignment symbols 231, and n3 is the number of the third alignment symbols 231.

Each of the fourth reference frames 141 is attached with a specific value marking different from others such that when one of the fourth frames 141 aligns with one of the fourth alignment symbols 241, the specific value marking indicates the amount of the misalignment between the first stack layer L1 and the second stack layer L2 along the Y direction.

The specific value markings attached to the fourth frames 141 may be sequentially labeled as 0, 1*D, 2*D . . . along the Y direction, or may be sequentially and symmetrically labeled as . . . −2*D, −1*D, 0, 1*D, 2*D . . . along the Y direction, wherein D is determined by D=Δd=d−d'=d/n4, d is a distance between centers of two adjacent fourth frames 141, d' is a distance between centers of two adjacent fourth alignment symbols 241, and n4 is numbers of the fourth alignment symbols 241.

When the first stack layer L1 is stacked with the second stack layer L2, one of the plurality of first alignment symbols 211 and third alignment symbols 231 is aligned with one of the plurality of first frames 111 and third frames 131 in the X-direction, and one of the plurality of second alignment symbols 221 and fourth alignment symbols 241 is aligned with one of the plurality of second frames 121 and fourth frames 141 in the Y-direction. A horizontal misalignment which an aligned first frame or an aligned third frame corresponds to is the misalignment in the X-direction between the first stack layer L1 and the second stack layer L2. A vertical misalignment which an aligned second frame or an aligned fourth frame corresponds to is the misalignment in the Y-direction between the first stack layer L1 and the second stack layer L2.

In the present embodiment, c=d=20 µm, c'=d'=18.5 µm, and thus C=D=1.5 µm.

Hence, there are two sorts of measurement accuracies in the X-direction and the Y-direction. Corresponding X-direction misalignment F1 may be found in the pattern 11 and the pattern 12, and corresponding Y-direction misalignment F2 may be found in the pattern 13 and the pattern 14.

Of course, the accuracy described above is only an illustration. The measurement accuracy may be adjusted by changing the distance of centers of the frames on the reference pattern structure and the distance of centers of the alignment symbols on the alignment pattern layer.

Preferably, according to an embodiment, the frames in the middle of the patterns 13 and 14, and the alignment symbols in the middle of the patterns 23 and 24 may be omitted to avoid repetition.

In view of the above embodiment, the method for observing misalignments is the same as the method described above. Since the specific value markings attached to the first and third frames may be symmetrically labeled (for example, symmetrically with respect to the origin of the X-axis) and the specific value markings may be symmetrically labeled (for example, symmetrically with respect to the origin of the Y-axis), the present embodiment may determine the misalignments along the positive direction and the negative direction of the X-axis and the Y-axis.

Figure 8:
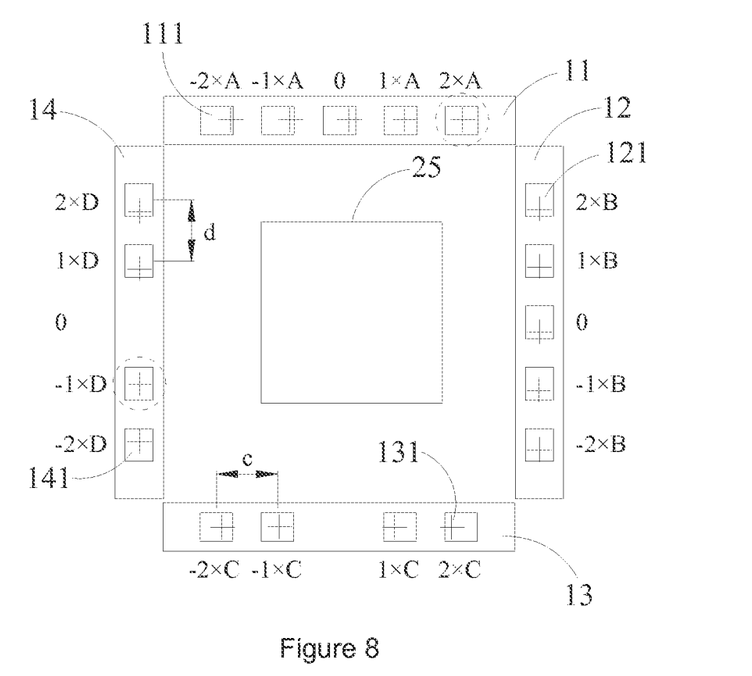
FIG. 8 shows a schematic diagram of a position relationship between frames and symbols after stacking of a first stack layer and a second stack layer.

As shown in FIG. 8, reading is performed through the method described above. The marks cycled by the dotted lines represent the X-direction misalignment F1=2*A=1 µm and the Y-direction misalignment F2=−1*D=−1.5.

Furthermore, according to an embodiment, a center pattern 25 (for example, a square) may be formed in the middle of the alignment pattern structure 2. A misalignment of a center of the center pattern 25 from a center of the reference pattern structure 1 may be measured using an inspection and measuring equipment (not shown), and then the alignment condition of the frames on the reference pattern structure 1 and the alignment symbols on the alignment pattern structure 2 may be observed using a camera tool or a microscope to quickly determine the misalignments in the X-direction and the Y-direction and thereby to correct misalignments that are measured before.

According to an embodiment, the reference pattern structure and the alignment pattern structure may be formed by sputtering, vapor deposition (VD), or chemical vapor deposition (CVD).

In addition, above explanation is made mainly using the stack structure having two layers as an example. In actual manufacturing process of TFT and LTPS, it usually needs to stack thirteen pattern layers. The multilayered structures of the present disclosure are also applicable.

Figure 9:
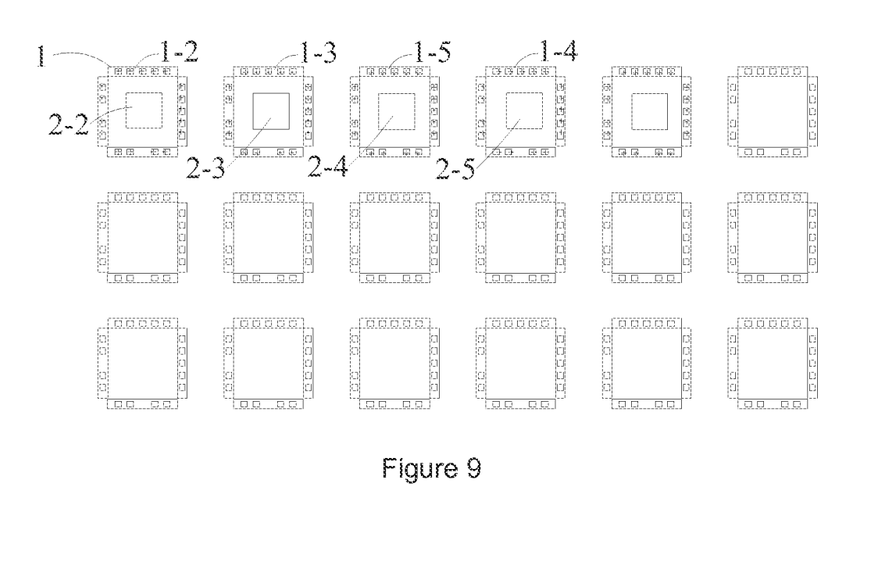
FIG. 9 shows a schematic diagram of a multilayered structure.

FIG. 9 shows a schematic diagram of a stacked multilayered structure. A plurality of reference pattern structures 1 including reference pattern structures 1-2, 1-3, 1-4, . . . are arranged on the first stack layer. The alignment pattern structure 2-2 on the second stack layer corresponds to one of the reference pattern structures, for example, the reference pattern structure 1-2. The multilayered structure may further include a third stack layer having an alignment pattern structure 2-3 formed thereon, and the alignment pattern structure 2-3 formed on the third stack layer is corresponding to one of the reference pattern structures on the first stack layer (for example, the reference pattern structure 1-3) and does not overlap with the alignment pattern structure 2-2 on the second stack layer.

The multilayered structure may further include a fourth stack layer having an alignment pattern structure 2-4 formed thereon. The alignment pattern structure 2-4 on the fourth stack layer corresponds to one of the reference pattern structures on the first stack layer (for example, the reference pattern structure 1-5) and does not overlap with the alignment pattern structure 2-2 on the second stack layer and the alignment pattern structure 2-3 on the third stack layer. The multilayered structure may further include a fifth stack layer having an alignment pattern structure 2-5 formed thereon. The alignment pattern structure 2-5 corresponds to one of the reference pattern structures on the fourth stack layer (for example, the reference pattern structure 1-4).

Thus, by forming the multilayered structures using the above method, misalignments between layers may be observed. Moreover, since the reference pattern structures and/or alignment pattern structures on each layer have distinct positions, observation may not be influenced due to pattern overlap.

The configuration and principle of measurement components for measuring misalignments in the multilayered structure is illustrated as above. In the following description, how to measure misalignments between the multilayered structures on the substrate using the measurement components will be illustrated with reference to LTPS manufacturing process.

The multilayered structure may have above-mentioned structures. The method may include the steps of: stacking the first stack layer and the second stack layer; observing a first reference which is aligning with one of the second references, and reading a marking attached to the first reference which is aligning with one of the second references to calculate misalignment between the first stack layer and the second stack layer.

According to an embodiment, the first references of the reference pattern structure have first reference marks arranged along an first direction and second reference marks arranged along a second direction perpendicular to the first direction, and the second references of the alignment pattern structure have first alignment marks arranged along the first direction and second alignment marks arranged along the second direction.

According to an embodiment, the observing step includes observing a first reference mark which is aligning with one of the first alignment marks and observing a second reference mark which is aligning with one of the second alignment marks; and the reading step includes reading a marking attached to the first reference mark which is aligning with one of the first alignment references to calculate the misalignment between the first stack layer and the second stack layer along the first direction and reading a marking attached to the second reference mark which is aligning with one of the second alignment references to calculate the misalignment between the first stack layer and the second stack layer along the second direction.

According to an embodiment, said first reference marks may include a plurality of first frames and said second reference marks may include a plurality of second frames; and said first alignment marks may include a plurality of first alignment symbols and said second alignment marks may include a plurality of second alignment symbols.

The above observing steps may be implemented by observation using a camera tool or a microscope.

A center pattern may be formed in the middle of the alignment pattern structure. Before the above observing step, the measuring method may further include: measuring a misalignment between a center of the center pattern on the second stack layer and a center of the reference pattern structure on the first stack layer using inspection and measuring equipments.

In the actual manufacturing process of LTPS, it is usually needed to stack thirteen pattern layers. In the present embodiment, a plurality of reference pattern structures are distributed on a first layer, a fourth layer, and a seventh layer. One alignment pattern structure is distributed on each of a second layer to a thirteenth layer. Specifically, thirteen reference pattern structures may be distributed on the first layer, the fourth layer, and the seventh layer; the second layer may have one alignment pattern structure formed thereon which corresponds to the reference pattern structure on the first stack layer. When the second layer is stacked on the first layer, the alignment condition between the alignment pattern structure and the reference pattern structure is observed. And then, the third layer is stacked. The third layer has an alignment pattern structure corresponding to one of the reference patter structures on the first stack layer. And then, the fourth layer is stacked. The fourth layer has a reference pattern structure and also one alignment pattern structure. The one alignment pattern structure corresponds to one of the reference patter structures on the first layer. And then, the fifth layer and the sixth layer are stacked sequentially. They have alignment pattern structures corresponding to one of the reference pattern structures on the fourth layer. And then, the seventh layer is stacked. The seventh layer has a reference pattern structure and one alignment pattern structure. The one alignment pattern structure corresponds to one of the reference patter structures on the fourth layer. And then, the eighth layer to the thirteenth layer are stacked sequentially. They have an alignment pattern structure corresponding to one of the reference pattern structures on the seventh layer.

The process of the multilayered stack structure described above is the same with the existing manufacturing process. However, by employing measurement components for measuring misalignments in the multilayered structure as described in the present discourse, markings are formed on each of stack layers, and thus it is possible to quickly and accurately measure misalignments in respective layers with no influence on the existing process. Moreover, after implementing measurement using existing inspection and measurement equipments, people may observe the marks formed on respective layers using captured photographs, judge whether the measured data obtained by the inspection and measurement equipments is correct, and thus quickly correct possible measurement error of the inspection and measurement equipments so as to avoid adverse effects on subsequent processes.

The exemplary embodiments of the present disclosure are specifically shown and described above. It should be understood that the present disclosure is not limited the embodiments disclosed herein. Instead, the present disclosure is intended to encompass various and equivalent arrangement within the spirit and scope of append claims.

What is claimed is:

1. An LTPS multilayered structure comprising:
   a first stack layer having a reference pattern structure formed thereon and provided with uniformly distributed first references;
   a second stack layer disposed on the first stack layer and having an alignment pattern structure formed thereon and provided with uniformly distributed second references each selectively aligning with one of the first references so that misalignment between the first stack layer and the second stack layer is precisely calculated by markings attached to each of the first references;
   wherein the first references of the reference pattern structure have first reference marks arranged along a first direction and second reference marks arranged along a second direction perpendicular to the first direction, and the second references of the alignment pattern structure have first alignment marks arranged along the first direction and second alignment marks arranged along the second direction;
   wherein said first reference marks comprise a plurality of first frames and said second reference marks comprise a plurality of second frames;
   wherein said first alignment marks comprise a plurality of first alignment symbols and said second alignment marks comprise a plurality of second alignment symbols.

2. The LTPS multilayered structure as claimed in claim 1, wherein each of the first frames is attached with a specific value marking different from others such that when one of the first frames aligns with one of the first alignment symbols, the specific value marking indicates amount of the misalignment between the first stack layer and the second stack layer along the first direction.

3. The LTPS multilayered structure as claimed in claim 2, said specific value markings attached to said first frames are sequentially labeled as 0, 1*A, 2*A . . . along the first direction or sequentially and symmetrically labeled as . . . −2*A, −1*A, 0, 1*A, 2*A . . . along the first direction, wherein A is determined by $A=\Delta a=a-a'=a/n1$; wherein:
   a is a distance between centers of two adjacent first frames;
   a' is a distance between centers of two adjacent first alignment symbols; and
   n1 is the number of the first alignment symbols.

4. The LTPS multilayered structure as claimed in claim 1, wherein each of the second frames is attached with a specific value marking different from others such that when one of the second frames aligns with one of the second alignment symbols, the specific value marking indicates amount of the misalignment between the first stack layer and the second stack layer along the second direction.

5. The LTPS multilayered structure as claimed in claim 4, wherein said specific value markings attached to said second frames are sequentially labeled as 0, 1*B, 2*B . . . along the second direction or sequentially and symmetrically labeled as . . . −2*B, −1*B, 0, 1*B, 2*B . . . along the second direction, wherein B is determined by $B=\Delta b=b-b'=b/n2$; wherein:
   b is a distance between centers of two adjacent second frames;
   b' is a distance between centers of two adjacent second alignment symbols; and
   n2 is the number of the second alignment symbols.

6. The LTPS multilayered structure as claimed in claim 1, wherein the first references further have third reference marks arranged along the first direction and fourth reference marks arranged along the second direction, and the first, the second, the third and the fourth reference marks form a frame shape;
   wherein the second references further have third alignment marks arranged along the first direction and fourth alignment marks arranged along the second direction, and the first, the second, the third and the fourth alignment marks form a frame shape.

7. The LTPS multilayered structure as claimed in claim 6, wherein said third reference marks comprise a plurality of third frames and said fourth reference marks comprise a plurality of fourth frames.

8. The LTPS multilayered structure as claimed in claim 7, wherein said third alignment marks comprise a plurality of third alignment symbols and said fourth alignment marks comprise a plurality of fourth alignment symbols.

9. The LTPS multilayered structure as claimed in claim 8, wherein each of the third frames is attached with a specific value marking different from others such that when one of the third frames aligns with one of the third alignment symbols, the specific value marking indicates the amount of the misalignment between the first stack layer and the second stack layer along the first direction.

10. The LTPS multilayered structure as claimed in claim 9, wherein said specific value markings attached to said third frames are sequentially labeled as 0, 1*C, 2*C . . . along the first direction or sequentially and symmetrically labeled as . . . −2*C, −1*C, 0, 1*C, 2*C . . . along the first direction, wherein C is determined by $C=\Delta c=c-c'=c/n3$; wherein:
   c is a distance between centers of two adjacent third frames;
   c' is a distance between centers of two adjacent third alignment symbols; and
   n3 is the number of the third alignment symbols.

11. The LTPS multilayered structure as claimed in claim 8, wherein each of the fourth reference frames is attached with a specific value marking different from others such that when one of the fourth frames aligns with one of the fourth alignment symbols, the specific value marking indicates the amount of the misalignment between the first stack layer and the second stack layer along the second direction.

12. The LTPS multilayered structure as claimed in claim 11, wherein said specific value markings attached to said fourth frames are sequentially labeled as 0, 1*D, 2*D . . . along the second direction or sequentially and symmetrically labeled as . . . −2*D, −1*D, 0, 1*D, 2*D . . . along the second direction, wherein D is determined by $D=\Delta d=d-d'=d/n4$; wherein:

d is a distance between centers of two adjacent fourth frames;

d' is a distance between centers of two adjacent fourth alignment symbols; and n4 is numbers of the fourth alignment symbols.

13. The LTPS multilayered structure as claimed in claim 11, wherein the first stack further have other pattern structure formed thereon; and the LTPS multilayered structure further comprises a third stack layer having an alignment pattern structure formed thereon, and the alignment pattern structure formed on the third stack layer is corresponding to one of the reference pattern structures on the first stack layer and does not overlap with the alignment pattern structure on the second stack layer.

14. A method for measuring misalignment between a plurality of stack layers in an LTPS multilayered structure, wherein the LTPS multilayered structure comprises:

a first stack layer having a reference pattern structure formed thereon and provided with uniformly distributed first references;

a second stack layer disposed on the first stack layer and having an alignment pattern structure formed thereon and provided with uniformly distributed second references each selectively aligning with one of the first references;

wherein the first references of the reference pattern structure have first reference marks arranged along a first direction and second reference marks arranged along a second direction perpendicular to the first direction, and the second references of the alignment pattern structure have first alignment marks arranged along the first direction and second alignment marks arranged along the second direction;

wherein said first reference marks comprise a plurality of first frames and said second reference marks comprise a plurality of second frames;

wherein said first alignment marks comprise a plurality of first alignment symbols and said second alignment marks comprise a plurality of second alignment symbols;

wherein the method comprises:

stacking the first stack layer and the second stack layer;

observing a first reference which is aligning with one of the second references, and reading a marking attached to the first reference which is aligning with one of the second references to calculate misalignment between the first stack layer and the second stack layer.

15. The method as claimed in claim 14, wherein the observing step comprises observing a first reference mark which is aligning with one of the first alignment marks and observing a second reference mark which is aligning with one of the second alignment marks; and the reading step comprises reading a marking attached to the first reference mark which is aligning with one of the first alignment references to calculate the misalignment between the first stack layer and the second stack layer along the first direction and reading a marking attached to the second reference mark which is aligning with one of the second alignment references to calculate the misalignment between the first stack layer and the second stack layer along the second direction.

* * * * *